(12) United States Patent
Saenger et al.

(10) Patent No.: US 9,645,503 B2
(45) Date of Patent: May 9, 2017

(54) COLLECTOR

(71) Applicant: Carl Zeiss SMT GmbH, Oberkochen (DE)

(72) Inventors: Ingo Saenger, Heidenheim (DE); Joerg Zimmermann, Aalen (DE); Daniel Kraehmer, Essingen (DE); Johannes Ruoff, Aalen (DE); Martin Meier, Heidenheim (DE); Frank Schlesener, Oberkochen (DE); Christoph Hennerkes, Huettlingen (DE); Wolfgang Singer, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 354 days.

(21) Appl. No.: 14/210,625

(22) Filed: Mar. 14, 2014

(65) Prior Publication Data

US 2014/0192339 A1 Jul. 10, 2014

Related U.S. Application Data

(63) Continuation of application No. PCT/EP2012/069939, filed on Oct. 9, 2012.
(Continued)

(30) Foreign Application Priority Data

Oct. 11, 2011 (DE) .................. 10 2011 084 266

(51) Int. Cl.
G03B 27/54 (2006.01)
G03F 7/20 (2006.01)
(Continued)

(52) U.S. Cl.
CPC .............. *G03F 7/702* (2013.01); *B82Y 10/00* (2013.01); *G02B 19/0023* (2013.01);
(Continued)

(58) Field of Classification Search
CPC ............ G02B 19/0023; G02B 19/0047; G02B 27/286; G02B 17/0673; G02B 19/0071;
(Continued)

(56) References Cited

U.S. PATENT DOCUMENTS

| | | |
|---|---|---|
| 6,859,515 B2 | 2/2005 | Schultz et al. |
| 2004/0183031 A1 | 9/2004 | Silverman et al. |

(Continued)

FOREIGN PATENT DOCUMENTS

| | | | | |
|---|---|---|---|---|
| DE | 10 2007 041 004 A1 | 3/2009 | | |
| DE | WO 2011039136 A1 * | 4/2011 | ......... | G02B 27/0905 |

(Continued)

OTHER PUBLICATIONS

German Office Action, with translation thereof, for corresponding DE Appl No. 10 2011 084 266.7, dated Jul. 31, 2012.
(Continued)

*Primary Examiner* — Deoram Persaud
(74) *Attorney, Agent, or Firm* — Fish & Richardson P.C.

(57) ABSTRACT

A collector for a projection exposure apparatus for microlithography comprises a plurality of reflective sections which are embodied and arranged in such a way that they can be impinged upon during the focusing of radiation from a first focus into a second focus with angles of impingement in a predefined angular spectrum.

22 Claims, 6 Drawing Sheets

Related U.S. Application Data

(60) Provisional application No. 61/545,629, filed on Oct. 11, 2011.

(51) Int. Cl.
  *G21K 1/06* (2006.01)
  *G02B 19/00* (2006.01)
  *G02B 27/28* (2006.01)
  *B82Y 10/00* (2011.01)

(52) U.S. Cl.
  CPC ..... *G02B 19/0047* (2013.01); *G02B 19/0071* (2013.01); *G02B 19/0095* (2013.01); *G02B 27/286* (2013.01); *G03F 7/70166* (2013.01); *G03F 7/70175* (2013.01); *G03F 7/70566* (2013.01); *G21K 1/062* (2013.01); *G21K 2201/061* (2013.01); *G21K 2201/064* (2013.01); *G21K 2201/067* (2013.01)

(58) Field of Classification Search
  CPC ............. G02B 19/0095; G03F 7/70166; G03F 7/70175; G03F 7/702; G03F 7/70566; G21K 1/062; G21K 2201/061; G21K 2201/064; G21K 2201/067; B82Y 10/00
  See application file for complete search history.

(56) References Cited

U.S. PATENT DOCUMENTS

| | | |
|---|---|---|
| 2004/0233531 A1 | 11/2004 | Bratt et al. |
| 2004/0257546 A1* | 12/2004 | Banine ............... G03F 7/70175 355/53 |
| 2006/0131515 A1 | 6/2006 | Partlo et al. |
| 2008/0013680 A1 | 1/2008 | Singer et al. |
| 2008/0018876 A1 | 1/2008 | Stuetzle et al. |
| 2008/0073592 A1 | 3/2008 | Panning et al. |
| 2008/0157006 A1* | 7/2008 | Wilhelmus Van Herpen ............... G03F 7/70858 250/492.2 |
| 2008/0225245 A1* | 9/2008 | Wood ................. G03F 7/70916 355/30 |
| 2008/0231820 A1* | 9/2008 | Wassink ................. B82Y 10/00 355/30 |
| 2008/0291406 A1 | 11/2008 | Soer et al. |
| 2009/0289205 A1 | 11/2009 | Moriya et al. |
| 2011/0073785 A1 | 3/2011 | Mercier-Ythier et al. |
| 2012/0162627 A1 | 6/2012 | Fiolka et al. |
| 2013/0021592 A1 | 1/2013 | Hempelmen et al. |

FOREIGN PATENT DOCUMENTS

| | | |
|---|---|---|
| DE | 10 2010 001 336 B3 | 7/2011 |
| EP | 1 650 786 A1 | 4/2006 |
| JP | H04-363698 A | 12/1992 |
| JP | 2007-027226 A | 2/2007 |
| JP | 2011-522434 A | 7/2011 |
| JP | 2013-506979 A | 2/2013 |
| WO | WO 2010/001015 A | 1/2010 |
| WO | WO 2011/039136 | 4/2011 |

OTHER PUBLICATIONS

International Search Report for corresponding PCT Appl No. PCT/EP2012/069939, dated Feb. 7, 2013.

Japanese office action, with English translation thereof, for corresponding JP Appl No. 2014-535025, dated Sep. 5, 2016.

* cited by examiner $$r(b) = r_0 \cdot e^{\tan(f^*) \cdot b}$$

COLLECTOR

CROSS-REFERENCE TO RELATED APPLICATIONS

The present application is a continuation of, and claims benefit under 35 USC 120 to, international application PCT/EP2012/069939, filed Oct. 9, 2012, which claims benefit under 35 USC 119 of German Application No. 10 2011 084 266.7, filed Oct. 11, 2011. International application PCT/EP2012/069939 also claims priority under 35 USC 119(e) to U.S. Provisional Application No. 61/545,629, filed Oct. 11, 2011. The entire disclosure of international application PCT/EP2012/069939 German Application No. 10 2011 084 266.7 are incorporated by reference herein.

The invention relates to a collector for a projection exposure apparatus. The invention additionally relates to an arrangement comprising a radiation source and a collector. The invention furthermore relates to an illumination system for a projection exposure apparatus and to a method for generating uniformly polarized radiation. Furthermore, the invention relates to a projection exposure apparatus for microlithography, a method for producing a microstructured component, and a microstructured component.

Collectors for projection exposure apparatuses are known from DE 10 2007 041 004 A1 and EP 1 650 786 A1.

It is an object of the present invention to improve a collector for a projection exposure apparatus.

This object is achieved according to the invention via a collector for a projection exposure apparatus for microlithography comprising. The collector includes at least one collector shell having at least one reflective section, a first focus and a second focus. The at least one reflective section is in each case embodied in such a way that: i. radiation can be reflected from the first focus into the second focus; and ii. an angular spectrum of angles of impingement on all reflective sections includes an angular range of a maximum of 10° around a predefined angle of impingement. The at least one collector shell has a plurality of reflective sections embodied in such a way that radiation emerging from a radiation source arranged at the first focus impinges on them in each case at angles of impingement in an angular spectrum of a maximum of 10° around a predefined angle of impingement, wherein the predefined angle of impingement is in each case identical for all reflective sections.

The heart of the invention consists in embodying the collector in such a way that radiation can be reflected from a first focus into a second focus, wherein the angle of impingement on all the reflective sections of the collector lies in a predefined angular range.

It has been recognized according to the invention that the polarization state of the radiation reflected by a reflective section of a collector, in particular also for EUV radiation, is dependent on the angle of incidence—also designated as angle of impingement—on the reflective section. It has furthermore been recognized that this can have the effect that the radiation transferred to an intermediate focus by a collector already comprises partly polarized radiation, wherein the polarization state is dependent on the propagation direction and thus varies, in particular, over the pupil at the intermediate focus. The invention therefore provides for the reflective section of the collector to be embodied and arranged in such a way that the angle of impingement on the reflective section in each case lies in an angular range of a maximum of 10° around a predefined angle of impingement. The angular range comprises in particular a maximum of 5°, in particular a maximum of 3°, in particular a maximum of 1°. The angle of impingement is thus at least substantially identical, in particular identical, for all the reflective sections. What can thereby be achieved is that all rays reflected by the collector have a uniform polarization state. The angular range is chosen, in particular, in such a way that the so-called IPS value ("Intensity in Preferred State") is constant over this range if the IPS value for the impinging radiation is constant. This also encompasses fluctuations of the IPS value of up to 10%, preferably up to 5%.

In accordance with one aspect of the invention, the collector comprises at least one collector shell having a plurality of reflective sections, wherein the predefined angle of impingement is in each case identical for all the reflective sections. The collector can comprise in particular at least two, in particular at least three, in particular at least four, reflective sections. The reflective sections are preferably embodied in each case in a manner rotationally symmetrical with respect to the optical axis of the collector. They are preferably embodied in simply connected fashion.

The spectrum of the angles of impingement is, in particular, identical for all the reflective sections of the collector shell. The total reflecting area available for reflecting the radiation from the radiation source into the intermediate focus can be enlarged via a larger number of reflective sections. The total radiation efficiency is thereby improved.

Preferably, the predefined angle of impingement deviates from the Brewster or pseudo-Brewster angle by a maximum of 10°, in particular by a maximum of 5°, in particular by a maximum of 3°, in particular by a maximum of 1°. The predefined angle of impingement can be, in particular, exactly the Brewster or pseudo-Brewster angle. In this case, the pseudo-Brewster angle denotes the angle at which that portion of the reflected light which is polarized parallel to the plane of incidence is minimal.

The radiation reflected by the respective reflective section is polarized in the best possible way at a predefined angle of impingement in the vicinity of the Brewster or pseudo-Brewster angle. It is s-polarized, in particular, which leads to an improved contrast in the lithographic imaging.

The predefined angle of impingement deviates from the Brewster or pseudo-Brewster angle in particular by a maximum of 10°, in particular by a maximum of 5°, in particular by a maximum of 3°, in particular by a maximum of 1°, in particular not at all.

In accordance with a further aspect of the invention, the reflective sections are in each case embodied in such a way that at the predefined angle of impingement they have a highest possible reflectance for EUV radiation having a predefined polarization state. The reflectance is in particular at least 45%, in particular at least 55%, in particular at least 65%. The predefined polarization state is s-polarization, in particular. The EUV radiation is, in particular, radiation having a wavelength in the range of 5 nm to 30 nm, in particular having a wavelength in the range of 13 nm to 14 nm or in the range of 6.5 nm to 7 nm.

Such an embodiment of the reflective sections can be achieved via a multilayer system optimized for a specific angle of impingement. The multilayer system can comprise in particular at least 20, in particular at least 40, in particular at least 80, layers. Appropriate materials for the layers include, in particular, molybdenum, silicon and ruthenium.

In an embodiment that can be produced in a particularly simple manner, the reflective sections are in each case embodied in the shape of an envelope of a truncated cone.

The reflective sections can also be embodied as planar in sections.

In these embodiments, a widening of the intermediate focus occurs as dimensions of the reflective sections increase. Therefore, the reflective sections are preferably made small. They have in particular in the direction of the optical axis a dimension of at most 10 cm, in particular at most 5 cm, in particular at most 3 cm, in particular at most 1 cm.

In accordance with one advantageous embodiment, the reflective sections are in each case embodied in aspherical fashion. The asphere can be chosen, in particular, in such a way that the radiation emerging from the first focus has an identical angle of impingement at every point of the reflective section.

In order to improve the luminous efficiency, the collector can have an additional collector shell. The additional collector shell is arranged in particular behind the first focus, that is to say in the opposite half-space relative to the second focus. The additional collector shell is preferably embodied in a manner rotationally symmetrical with respect to the optical axis. It can be arranged, in particular, in the shape of a spherical surface section around the first focus. What is thereby achieved is that the radiation emerging from the radiation source arranged at the first focus impinges substantially perpendicularly on the additional collector shell and is reflected back in the direction of the first focus without a change in the polarization state.

The additional collector shell can have a passage opening for electromagnetic radiation. This makes possible, in particular, the passage of laser radiation for exciting a plasma at the first focus. The passage opening is arranged, in particular, in the region of the point of intersection of the additional collector shell with the connecting line of the two foci, that is to say on the extension of the optical axis. However, it can also be advantageous to arrange the passage opening off-axis.

A further object of the invention is to improve an arrangement for focusing radiation. This object is achieved via an arrangement for a projection exposure apparatus for microlithography including which includes a radiation source for generating electromagnetic radiation, and a collector having at least one collector shell having at least one reflective section. The at least one reflective section is embodied in such a way that the unpolarized radiation that emerges from the radiation source and impinges on it is reflected into an intermediate focus in such a way that the reflected radiation at the intermediate focus has a uniform polarization. The heart of the invention consists in embodying and arranging the reflective sections of a collector in such a way that the radiation from a radiation source that is reflected by them is reflected in an intermediate focus and has a uniform polarization there. The radiation at the intermediate focus has a direction-independent polarization state, in particular. In other words, the polarization state is constant over the pupil at the intermediate focus.

A further object of the invention is to improve an illumination system for a projection exposure apparatus for microlithography. This object is achieved via an illumination system for a projection exposure apparatus for microlithography which includes a radiation source for generating radiation and a collector as described above. The advantages correspond to those described for the collector.

The radiation source is, in particular, an EUV radiation source. The EUV radiation is generated, in particular, in the region of the first focus.

A further object of the invention is to improve a method for generating uniformly polarized radiation. This object is achieved via a method for generating uniformly polarized radiation which includes the following steps: providing a radiation source for generating radiation; providing a collector having a collector shell having at least one section that reflects the radiation; and arranging the radiation source in such a way that the radiation impinges on all of the reflective sections in each case in an angular range of a maximum of 10° around a predefined angle of impingement, wherein the at least one section is embodied and arranged in such a way that the radiation is reflected into a predefined focus. The advantages correspond to those described for the collector.

Further objects of the invention are to specify a projection exposure apparatus for microlithography comprising the illumination system according to the invention, a method for producing a component using the projection exposure apparatus, and a component produced by the method. These objects are achieved according to the invention via: 1) a projection exposure apparatus for microlithography which includes an illumination system as described above having an illumination optical unit for illuminating an object field with the radiation reflected by the collector, and a projection optical unit for projecting the object field into an image field; 2) a production method for producing a micro- or nano-structured component which includes the steps of providing a reticle, providing a wafer having a light-sensitive coating, projecting at least one section of the reticle onto the wafer with the aid of such a projection exposure apparatus, and developing the exposed light-sensitive coating on the wafer; and 3) a component produced by such a method.

The projection exposure apparatus is preferably embodied as a scanner. The projection exposure apparatus then has, both for the object to be imaged and for a substrate onto which imaging is effected, for example a wafer, and a holder that is displaceable in the scanning direction during the projection exposure.

The advantages of these subjects correspond to those that have already been discussed above.

Further advantages, details and particulars of the invention will become apparent from the description of a plurality of exemplary embodiments with reference to the drawings, in which:

FIG. 1 schematically shows a meridional section through a projection exposure apparatus for EUV projection lithography;

Figure 1:
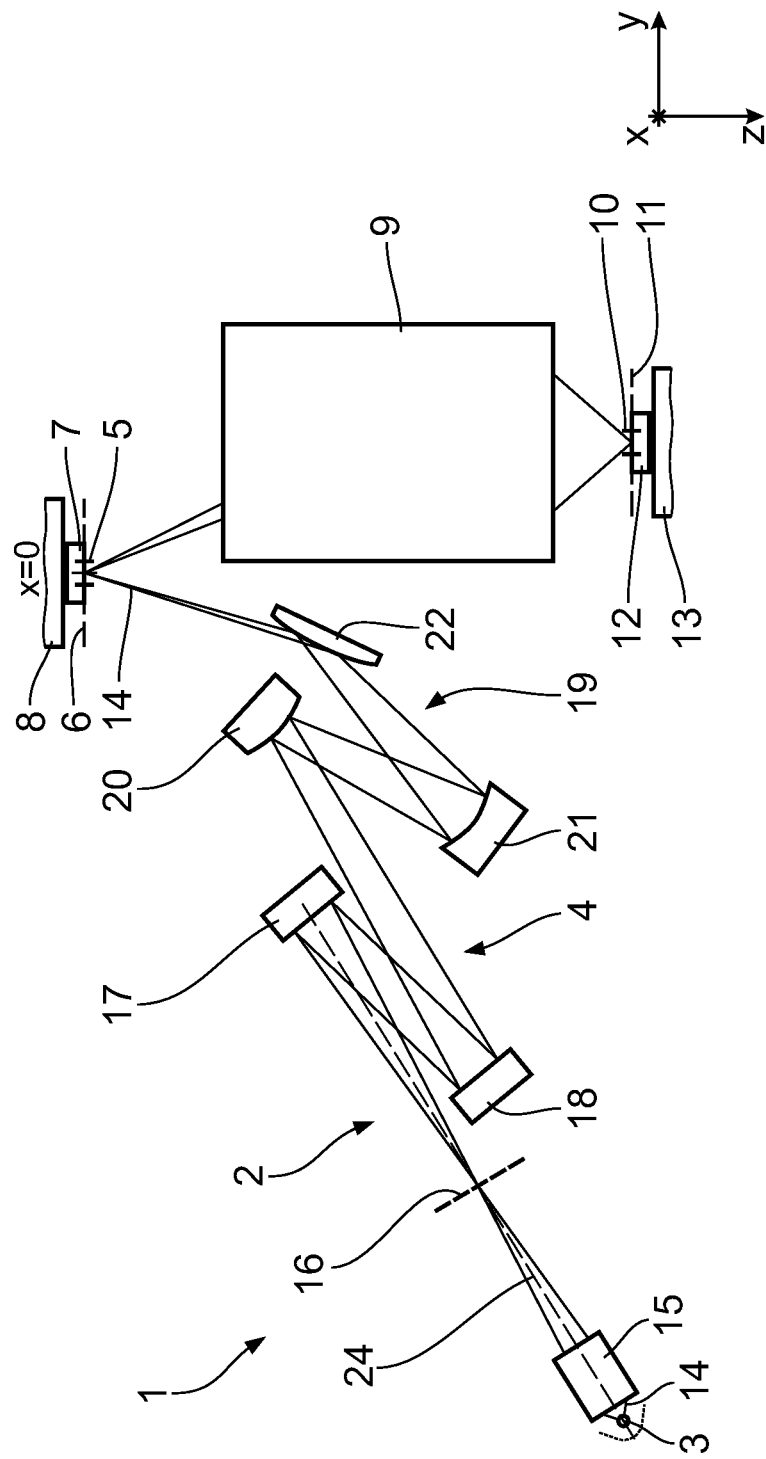

FIG. 1 shows schematically in a meridional section a projection exposure apparatus 1 for microlithography. An illumination system 2 of the projection exposure apparatus 1 has, besides a radiation source 3, an illumination optical unit 4 for the exposure of an object field 5 in an object plane 6. A reticle 7, which is arranged in the object field 5 and is held by a reticle holder 8 (illustrated only as an excerpt), is exposed in this case. The illumination optical unit 4 has an object-side numerical aperture of at least 0.33, in particular of at least 0.45, in particular of at least 0.6. A projection optical unit 9 serves for imaging the object field 5 into an image field 10 into an image plane 11. A structure on the reticle 7 is imaged onto a light-sensitive layer of a wafer 12 arranged in the region of the image field 10 in the image plane 11, the wafer being held by a wafer holder 13 (likewise illustrated schematically).

The radiation source 3 is an EUV radiation source having an emitted used radiation in the range of between 5 nm and 30 nm. This can be a plasma source, for example a GDPP (Gas Discharge-Produced Plasma) source or an LPP (Laser-Produced Plasma) source. The person skilled in the art can find information about such a radiation source from U.S. Pat. No. 6,859,515 B2, for example. EUV radiation 14 emerging from the radiation source 3 is concentrated by a collector 15. The EUV radiation 14 passes through an intermediate focal plane 16, in particular, before it impinges on a field facet mirror 17. The field facet mirror 17 is arranged in a plane of the illumination optical unit 4 which is optically conjugate with respect to the object plane 6.

The EUV radiation 14 is also designated hereinafter as illumination light or as imaging light.

Downstream of the field facet mirror 17, the EUV radiation 14 is reflected by a pupil facet mirror 18. The pupil facet mirror 18 is arranged in a pupil plane of the illumination optical unit 4, the pupil plane being optically conjugate with respect to a pupil plane of the projection optical unit 9. With the aid of the pupil facet mirror 18 and an imaging optical assembly in the form of a transfer optical unit 19 having mirrors 20, 21 and 22 designated in the order of the beam path, field facets of the field facet mirror 17 are imaged into the object field 5. The last mirror 22 of the transfer optical unit 19 is a grazing incidence mirror. The pupil facet mirror 18 and the transfer optical unit 19 form a sequential optical unit for transferring the illumination light 14 into the object field 5. The transfer optical unit 19 can be dispensed with, in particular, if the pupil facet mirror 18 is arranged in an entrance pupil of the projection optical unit 9.

For simpler description of positional relationships, a Cartesian xyz coordinate system is depicted in FIG. 1. In FIG. 1, the x-axis runs perpendicularly to the plane of the drawing into the latter. The y-axis runs toward the right. The z-axis runs downward. The object plane 6 and the image plane 11 both run parallel to the xy plane.

The reticle holder 8 is displaceable in a controlled manner such that, during the projection exposure, the reticle 7 can be displaced in a displacement direction in the object plane 6 parallel to the y-direction. The wafer holder 13 is correspondingly displaceable in a controlled manner such that the wafer 12 is displaceable in a displacement direction in the image plane 11 parallel to the y-direction. The reticle 7 and the wafer 12 can thereby be scanned by the object field 5, on the one hand, and by the image field 10, on the other hand. The displacement direction is also designated hereinafter as the scanning direction. The displacement of the reticle 7 and of the wafer 12 in the scanning direction can preferably be effected synchronously with one another. A first exemplary embodiment of the collector 15 is described in greater detail below with reference to FIG. 2.

The collector 15 comprises a collector shell 23 having a multiplicity of reflective sections 24. The reflective sections 24 are mechanically held by a holding device embodied as a supporting shell 25.

The reflective sections 24 are in each case embodied in such a way that the EUV radiation 14 is reflected from a first focus 26 into a second focus 27, also designated as intermediate focus. In this case, the reflective sections are each arranged in such a way that an angle f of impingement, also designated as angle of incidence, in each case measured with respect to a normal 28 to the surface of the reflective section 24, at the point of impingement lies in an angular spectrum comprising an angular range of a maximum of 10° around a predefined angle f* of impingement. The angular range preferably comprises a maximum of 5°, in particular a maximum of 3°, in particular a maximum of 1°, around the predefined angle f* of impingement. The predefined angle f* of impingement is, in particular, the Brewster or pseudo-Brewster angle. The predefined angle f* of impingement deviates from the Brewster or pseudo-Brewster angle in particular by at most 10°, in particular by at most 5°, in particular by at most 3°, in particular by at most 1°.

Figure 2:
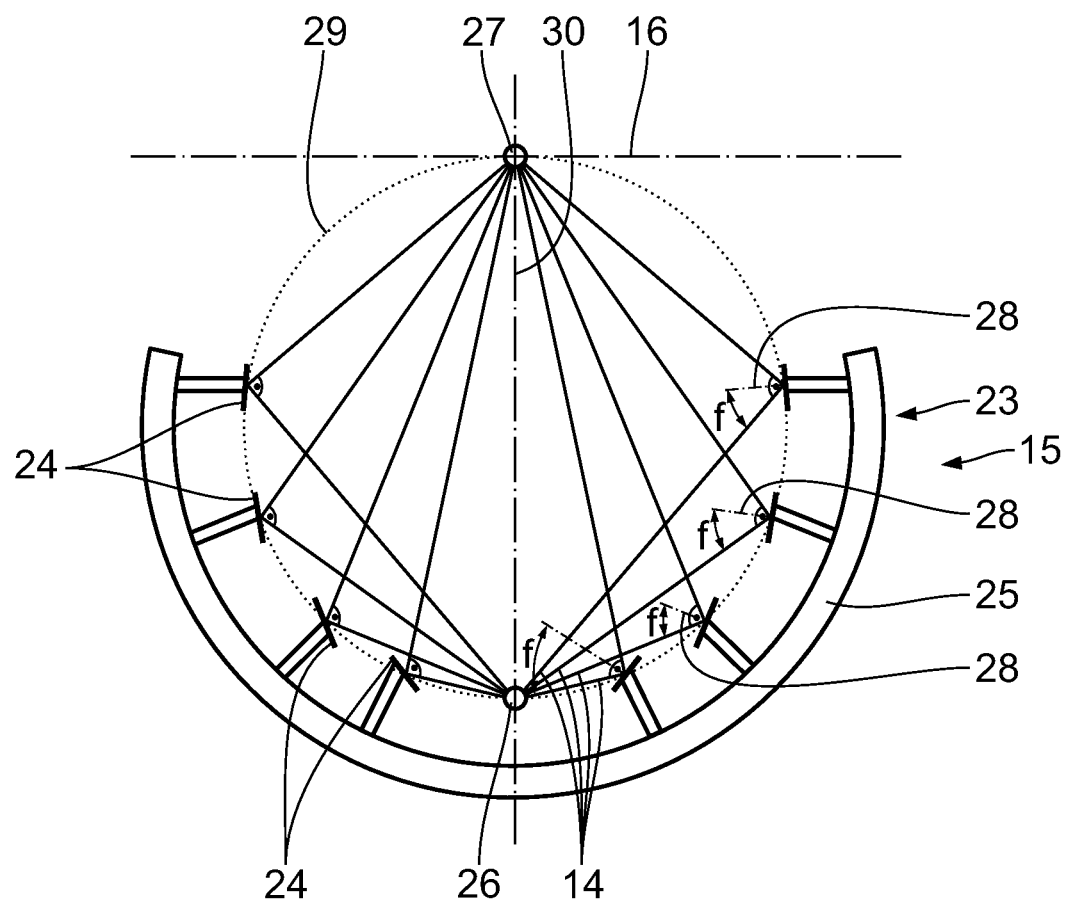
FIG. 2 shows a schematic cross section through a collector in accordance with a first exemplary embodiment.

In the embodiment illustrated in FIG. 2, the predefined angle f* of impingement is 45°. The arrangement of the reflective sections 24 is thereby defined in such a way that they are all arranged on a Thales circle 29 over the two foci 26, 27.

In the exemplary embodiment illustrated schematically in FIG. 2, the collector 15 comprises four reflective sections 24. It generally comprises at least one, in particular a plurality of reflective sections 24. The number of reflective sections 24 can lie in particular in the range of 5 to 100, in particular in the range of 10 to 70, in particular in the range of 20 to 50.

The reflective sections 24 are in each case embodied in a manner rotationally symmetrical about an optical axis 30 running through the two foci 26, 27.

The reflective sections 24 are in each case embodied in such a way that at the predefined angle f* of impingement they have a reflectance of at least 45%, in particular at least 55%, in particular at least 65%, for the EUV radiation 14, in particular for the s-polarized part thereof.

This is achieved, in particular, by virtue of the fact that the reflective sections 24 each have a multilayer system. The multilayer system comprises in particular at least 20, in particular at least 40, in particular at least 80, layers. In particular, molybdenum, silicon and ruthenium are provided as materials for the layers. For details of such a layer system, reference should be made to DE 10 2010 001 336 B3.

In the exemplary embodiment illustrated in FIG. 2, the reflective sections 24 are in each case embodied in the shape of an envelope of a truncated cone.

As viewed from the first focus 26, the reflective sections 24 cover a solid angle of at least $$\frac{\pi}{2} sr,$$

in particular of at least $\pi$ sr.

Figure 3:
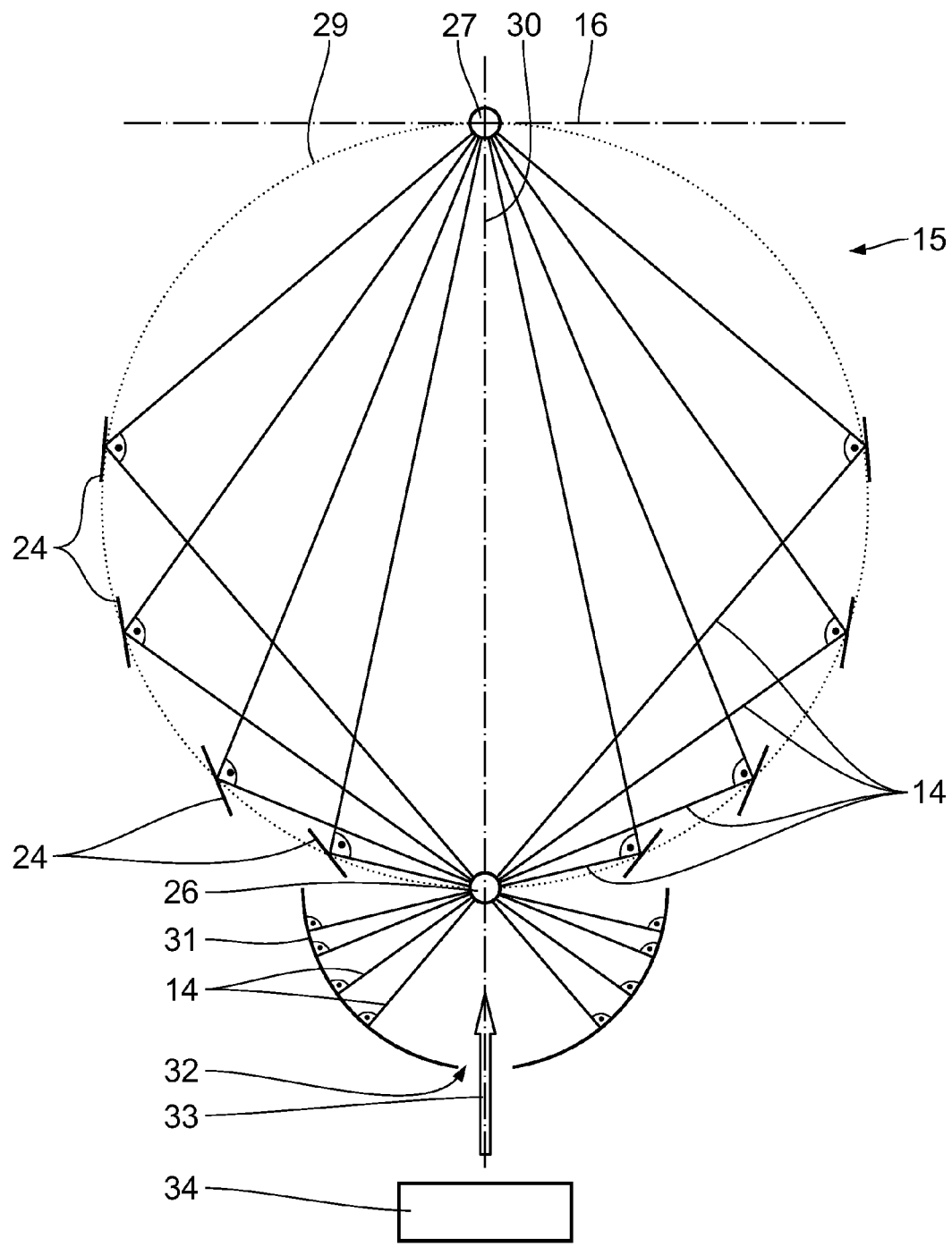
FIG. 3 shows a schematic cross section for elucidating further aspects of an advantageous embodiment of the collector.

In the exemplary embodiment illustrated in FIG. 3, the collector 15 comprises an additional reflective collector shell 31. The additional collector shell 31 is arranged in the shape of a spherical surface section around the first focus 26. It is embodied, in particular, in a manner rotationally symmetrical with respect to the optical axis 30. It has an EUV-reflecting coating on its inner side. For details of the coating, reference should again be made to DE 10 2010 001 336 B3. The additional collector shell 31 is arranged behind the first focus 26. This should be understood to mean that it is arranged in the opposite half-space relative to the second focus 27 with respect to the first focus 26. The radiation 14 emerging from the first focus 26 preferably impinges perpendicularly on the additional collector shell 31. It is therefore reflected back in the direction of the first focus 26. The radiation efficiency of the collector 15 is improved further by the additional collector shell 31.

The additional collector shell 31 has a passage opening 32 for electromagnetic radiation 33. The electromagnetic radiation 33 is, in particular, radiation in the infrared range, in particular having a wavelength of 10.6 μm. The passage opening 32 can also be transmissive to electromagnetic radiation having other wavelengths. The passage opening 32 serves for passing electromagnetic radiation 33 generated via a laser 34. The electromagnetic radiation 33 serves for generating a plasma in the region of the first focus 26. The first focus 26 is therefore also designated as a location of the radiation source 3 for generating the EUV radiation 14.

The passage opening 32 is arranged in the region of the optical axis 30, that is to say in the extension of the connecting line of the two foci 26, 27.

In an alternative embodiment, provision can be made for arranging the passage opening 32 off-axis with respect to the optical axis 30. In this case, the laser radiation from the laser 34 can be guided to the first focus 26 at an angle, in particular of at least 10°, in particular at least 30°, with respect to the optical axis 30. This prevents laser radiation from the laser 34 from passing directly along the optical axis 30 to the second focus 27.

Figure 4:
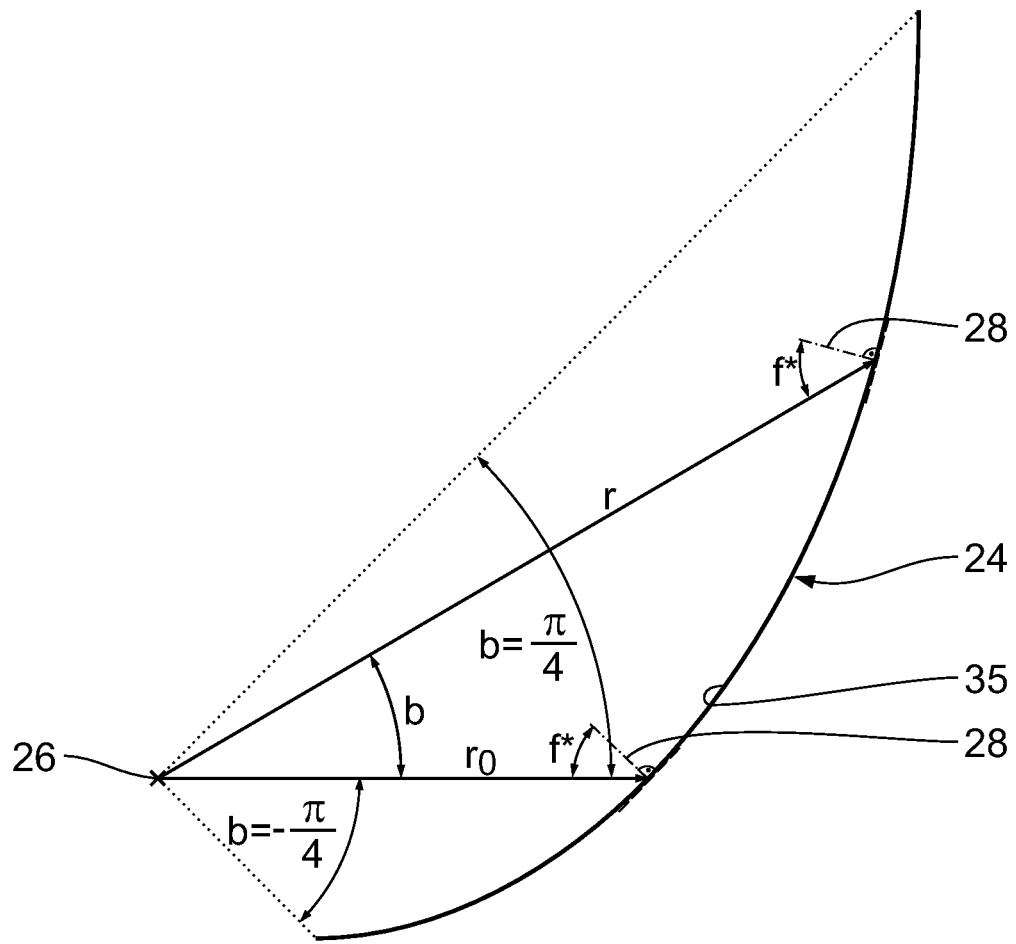
FIG. 4 shows a schematic illustration for clarifying the aspherical embodiment of the reflective sections of the collector in accordance with a further exemplary embodiment.

In accordance with one advantageous development, the reflective sections 24 have a reflective surface 35 embodied in aspherical fashion. As clarified schematically in FIG. 4, the asphericity of the reflective surface 35 can be parametrized as follows: $r(b)=r_0 \cdot e^{\tan(f^*) \cdot b}$. In this case, $r_0$ denotes the distance between the reflective surface 35 and the first focus 26 for illumination light 14 having a predefined propagation direction, b denotes the angle relative to the propagation direction, measured in radians, and f* denotes the predefined angle of impingement. For f*=45°, the parametrization is simplified as $r(b)=r_0 \cdot e^b$.

The arrangement according to the invention of the radiation source 3 and of the collector 15 has the effect that the unpolarized radiation 14 emerging from the radiation source 3 and impinging on the reflective sections 24 of the collector 15 is reflected into the intermediate focus 27 in such a way that the reflected radiation 14 has a uniform polarization at the intermediate focus 27. The polarization state of the radiation 14 at the intermediate focus 27 is therefore direction-independent. The polarization state of the EUV radiation 14 is constant in particular over the pupil in the intermediate focal plane 16.

Figure 5:
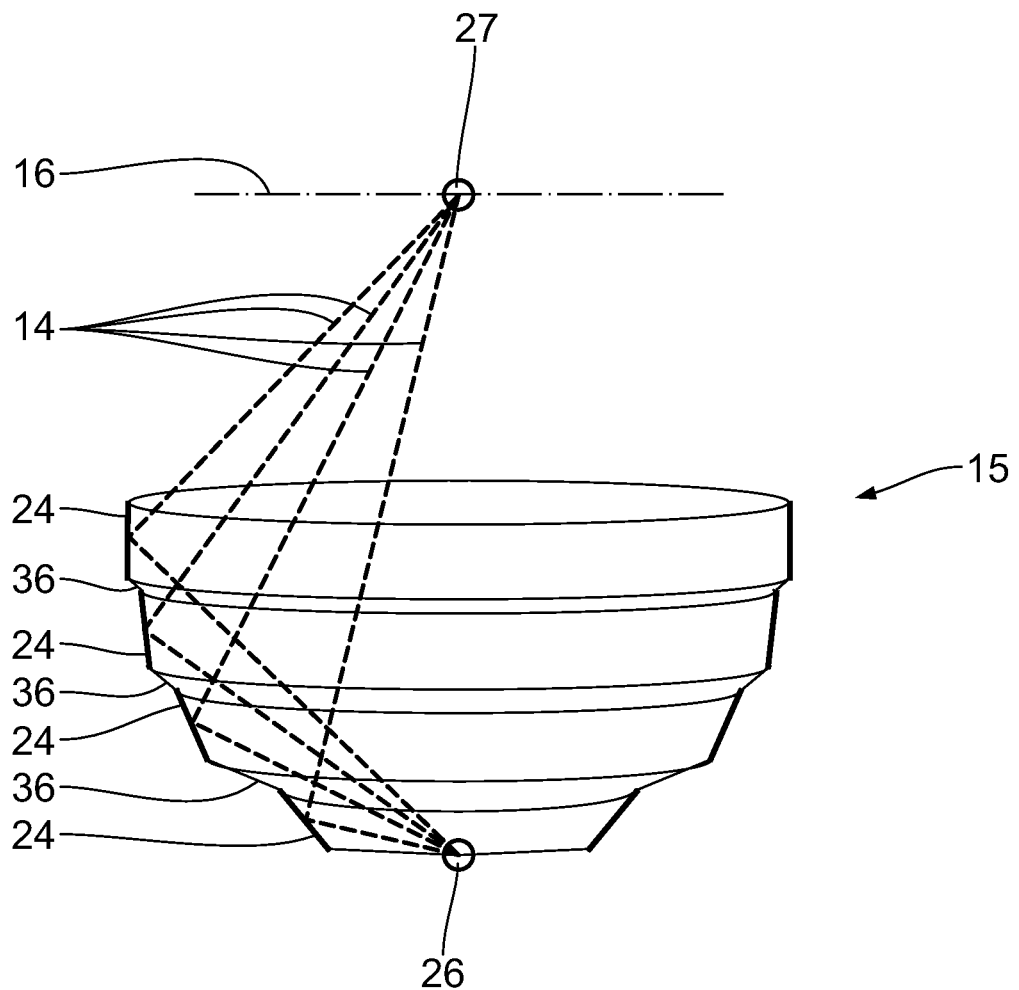
FIG. 5 shows a schematic illustration of a further embodiment of the collector.
Figure 6C:
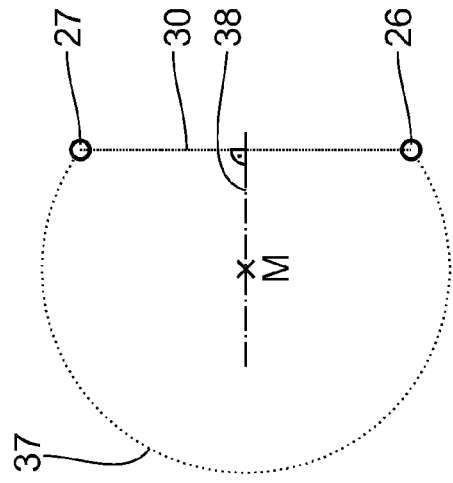
FIGS. 6a to 6d show illustrations for clarifying the constructional design of the collector in accordance with a further exemplary embodiment.
Figure 6B:
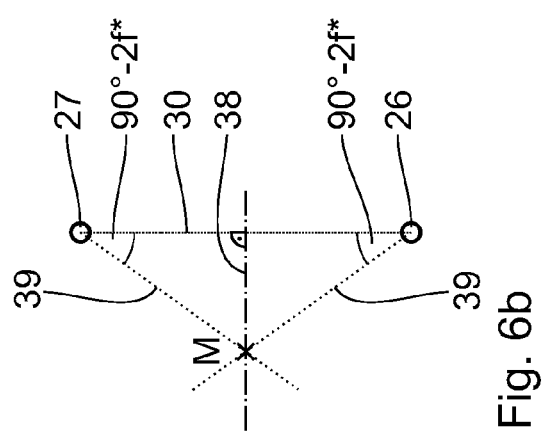
Figure 6A:
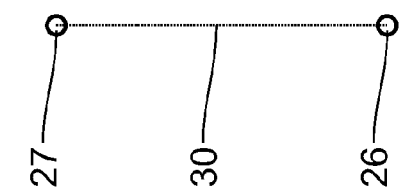
Figure 6D:
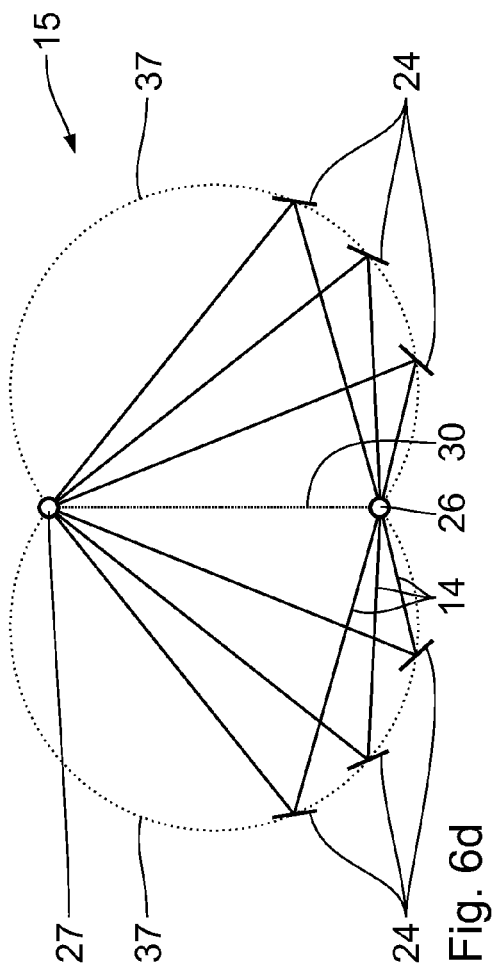

An alternative embodiment of the collector 15 is illustrated in FIG. 5. In this embodiment, the reflective sections 24 are in each case mechanically connected to one another by connecting pieces 36. The connecting pieces 36 can be made of the same material, such as a substrate of the reflective sections 24. In this case, the collector 15 can be produced, in particular milled, from one piece, in particular. The connecting pieces 36 can also be made of a different material from the substrate of the reflective sections 24. They can be fitted to the reflective sections 24 subsequently, in particular. They can be embodied in connected or unconnected fashion. They can have further functions, in particular the arrangement of a cooling device for cooling the reflective sections 24 of the collector 15.

The arrangement of the reflective sections 24 corresponds to that in the exemplary embodiment described previously.

In this embodiment, too, an additional reflective reflector shell 31 can be provided behind the first focus 26.

A further exemplary embodiment of the invention is described below with reference to FIGS. 6a to 6d. The exemplary embodiment substantially corresponds to the exemplary embodiments described previously, to the description of which reference is hereby made. In this exemplary embodiment, however, the predefined angle f* of impingement is not exactly 45°. This has the consequence that the reflective sections 24 are not arranged on the Thales circle 29 over the two foci 26, 27. The reflective sections 24 are in each case arranged in such a way that their intersection with a plane through the two foci 26, 27 lies on a section 37 of an arc of a circle, the midpoint M of which section lies at a distance from the optical axis 30 on a midperpendicular 38 in such a way that an angle between the connecting lines 39 each defined by the midpoint M and one of the two foci 26, 27 and the optical axis 30 forms an angle of 90°-2f*. In this case, as illustrated by way of example by FIGS. 6a to 6d, the position of the reflective sections 24 is determined with the aid of the circumferential angle theorem or peripheral angle theorem. The individual reflective sections 24 are embodied, in particular, once again in a manner rotationally symmetrical with respect to the optical axis 30.

The functioning of the collector 15 is described again below. The radiation source 3 is arranged in such a way that the EUV radiation 14 is generated in the region of the first focus 26. The collector 15 is embodied and arranged in such a way that the radiation 14 emerging from the first focus 26 in each case impinges on all of the reflective sections 24 in a predefined angular range around a predefined angle f* of impingement. The angular range comprises in particular a maximum of 10°, in particular a maximum of 5°, in particular a maximum of 3°, in particular a maximum of 1°. The predefined angle f* of impingement is preferably the Brewster or pseudo-Brewster angle. The predefined angle f* of impingement deviates from the Brewster or pseudo-Brewster angle in particular by at most 10°, in particular by at most 5°, in particular by at most 3°, in particular by at most 1°.

The reflective sections 24 of the collector 15 are in each case embodied and arranged in such a way that the radiation 14 is reflected into the second focus 27. Since the angles f of impingement of the EUV radiation 14 from the radiation source 3 lie in the same range, in particular are identical, for all the reflective sections 24 of the collector 15, the EUV radiation 14 reflected into the second focus 27 is uniformly polarized.

During the use of the projection exposure apparatus 1 with one of the collector variants described above, the reticle 7 and the wafer 12, which bears a coating light-sensitive to the illumination light 14, are provided. Afterward, at least one section of the reticle 7 is projected onto the wafer 12 with the aid of the projection exposure apparatus 1. During the projection of the reticle 7 onto the wafer 12, the reticle holder 8 and/or the wafer holder 13 can be displaced in a direction parallel to the object plane 6 and/or parallel to the image plane 11, respectively. The displacement of the reticle 7 and of the wafer 12 can preferably be effected synchronously with one another. Finally, the light-sensitive layer exposed by the illumination light 14 on the wafer 12 is developed. A micro- or nanostructured component, in particular a semiconductor chip, is produced in this way.

The invention claimed is:
1. A collector, comprising:
a collector shell comprising a plurality of reflective sections,
wherein:
the collector shell has a first focus and a second focus different from the first focus;

for each of the plurality of reflective sections, the reflective section is configured so that during use of the collector:
radiation is reflected from the first focus into the second focus; and
radiation emerging from a radiation source arranged at the first focus impinges the reflective section at angles of impingement in a spectrum of angles within a range of at most 10° around a predefined angle of impingement; and
the predefined angle of impingement is the same for each of the plurality of reflective sections; and
the collector is a microlithography collector.

2. The collector of claim 1, wherein the predefined angle of impingement deviates from the Brewster angle by at most 10°.

3. The collector of claim 1, wherein the reflective section is configured so that, at the predefined angle of impingement, the reflective section has a reflectance of at least 50% for EUV radiation.

4. A system, comprising:
a radiation source; and
the collector of claim 1,
wherein the system is a microlithography illumination system.

5. An apparatus, comprising:
an illumination system comprising the collector of claim 1; and
a projection optical unit,
wherein the apparatus is a microlithography projection exposure apparatus.

6. A method of using a microlithography projection exposure apparatus comprising an illumination system and a projection optical unit, the method comprising:
using the illumination system to illuminate a reticle; and
using the projection optical unit to project at least a section of the reticle onto a light-sensitive material,
wherein the illumination system comprises the collector of claim 1.

7. The collector of claim 1, wherein the number of reflective sections is in the range of 20 to 50.

8. The collector of claim 1, wherein each reflective section is rotationally symmetric with respect to an optical axis of the collector, and the plurality of reflective sections are continuous.

9. The collector of claim 1, wherein the reflective sections are mechanically held by a holding device embodied as a supporting shell.

10. The collector of claim 9, wherein the connecting pieces are made of the same material as a substrate of the reflective sections.

11. The collector of claim 1, wherein the reflective sections are in each case mechanically connected to one another by connecting pieces.

12. The collector of claim 1, wherein the plurality of reflective sections are a monolithic element.

13. The collector of claim 1, wherein the collector comprises an additional collector shell, and wherein the additional collector shell comprises a spherical surface section around the first focus.

14. A system, comprising:
a radiation source configured to generate unpolarized radiation; and
a collector comprising a collector shell comprising a reflective section configured so that, during use of the system when the unpolarized radiation emerges from the radiation source and impinges on the reflective section, the unpolarized radiation is reflected into an intermediate focus so that the reflected radiation at the intermediate focus has a uniform polarization,
wherein the system is a microlithography illumination system.

15. An apparatus, comprising:
an illumination system according to claim 14; and
a projection optical unit,
wherein the apparatus is a microlithography projection exposure apparatus.

16. A method, comprising:
impinging radiation on each reflective section of a collector shell within an angular range of at most 10° around a predefined angle of impingement for each reflective section,
wherein each reflective section of the collector shell is configured so the radiation is reflected into a predefined focus, and the radiation at the predefined focus has a direction independent polarization state.

17. A collector, comprising:
a collector shell comprising a plurality of reflective sections,
wherein:
the collector shell has a first focus and a second focus different from the first focus;
for each reflective section, the reflective section is configured so that during use of the collector:
radiation is reflected from the first focus into the second focus;
a spectrum of angles of impingement on the reflective section is within a range of at most 10° around a predefined angle of impingement;
the collector is a microlithography collector;
the reflective section is configured so that during use of the collector radiation emerging from a radiation source arranged at the first focus impinges the reflective section at angles of impingement in a spectrum of angles within a range of at most 10° around a predefined angle of impingement; and
the predefined angle of impingement is the same for each of the plurality of reflective sections;
the additional collector shell comprises a spherical surface section around the first focus; and
the collector comprises an additional collector shell.

18. The collector of claim 17, wherein the predefined angle of impingement deviates from the Brewster angle by at most 10°.

19. The collector of claim 17, wherein the reflective section is configured so that, at the predefined angle of impingement, the reflective section has a reflectance of at least 50% for EUV radiation.

20. The collector of claim 17, wherein the number of reflective sections is in the range of 20 to 50.

21. The collector of claim 17, wherein the additional collector shell has an opening configured to allow radiation to pass therethrough during use of the collector.

22. The collector of claim 21, wherein the opening is arranged off-axis with respect to an optical axis.

* * * * *